(12) United States Patent
Nozaki et al.

(10) Patent No.: US 6,656,659 B1
(45) Date of Patent: Dec. 2, 2003

(54) RESIST COMPOSITION SUITABLE FOR SHORT WAVELENGTH EXPOSURE AND RESIST PATTERN FORMING METHOD

(75) Inventors: Koji Nozaki, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 330 days.

(21) Appl. No.: 09/080,530

(22) Filed: May 18, 1998

(30) Foreign Application Priority Data

May 20, 1997 (JP) .............................. 9-130131

(51) Int. Cl.$^7$ .............................. G03F 7/039; G03F 7/30
(52) U.S. Cl. .................... 430/270.1; 430/326; 430/905; 430/910
(58) Field of Search .............................. 430/270.1, 905, 430/910, 326

(56) References Cited

U.S. PATENT DOCUMENTS 5,968,713 A * 10/1999 Nozaki et al. ............... 430/326
6,013,416 A * 1/2000 Nozaki et al. ............ 430/283.1

FOREIGN PATENT DOCUMENTS

| DE | 19626003 A1 | * | 1/1997 | .......... G03F/7/039 |
| JP | 9-90637 | | 11/1995 | |
| JP | 9-73173 A | | 3/1997 | |
| JP | 9090637 | * | 4/1997 | |

* cited by examiner

Primary Examiner—John S. Chu
(74) Attorney, Agent, or Firm—Armstrong, Westerman & Hattori, LLP

(57) ABSTRACT

A resist composition has a polymer containing a carboxyl group with a protective group at a side chain of a monomer unit, the polymer being insoluble to basic aqueous solution and becoming soluble to basic aqueous solution when the protective group of the carboxyl group is eliminated from the side chain, the protective group of the carboxyl group being represented by:

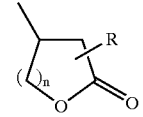

(1)

where R is a hydrogen atom or a single-bonded hydrocarbon group, n is an integer 1 to 4, and R is bonded to a position other than the ester bonded position.

15 Claims, No Drawings

RESIST COMPOSITION SUITABLE FOR SHORT WAVELENGTH EXPOSURE AND RESIST PATTERN FORMING METHOD

This application is based on Japanese Patent Application Hei 9-130131 filed on May 20, 1997, the entire contents of which are incorporated herein by reference.

BACKGROUND OF THE INVENTION a) Field of the Invention

The present invention relates to resist composition and a resist pattern forming method, and more particularly to resist composition suitable for exposure of short wavelength light such as excimer laser and a resist pattern forming method.

b) Description of the Related Art

With recent advancements of high integration in semiconductor integrated circuit devices, a sub-half micron rule (minimum line width) is now used for wiring patterns. It is desired to urgently establish micro processing techniques. In order to meet such requirements, short wavelength technologies have been vigorously developed in the field of photolithography in which exposure light is changing from a far ultraviolet range to a deep ultraviolet range. As the wavelength of exposure light becomes short, it is an urgent need to develop resist material which has a low light absorption and a high sensitivity in the short wavelength range and a high resistance to dry etching.

As new exposure technologies of semiconductor manufacture processes, photolithography techniques using krypton fluoride (KrF) excimer laser of 248 nm wavelength have been studied widely. As the resist material having a high sensitivity and a high resolution relative to KrF excimer laser, a resist composition incorporating a concept called a chemically amplified type has been proposed (for example, refer to Proc. Microcircuit Eng., 260 (1982) by J. M. J. Frechet et al, Digest of Technical Papers of 1982 Symposium on VLSI Technology by H. Ito et al, "Polymers in Electronics" by H. Ito et al, ACS Symposium Series 242, compiled by T. Davidson, ACS, 11 (1984), and U.S. Pat. No. 4,491,628).

The fundamental concept of this resist composition is based upon an apparent improvement on a quantum yield and hence an improved sensitivity obtained by catalyst reaction in a resist film.

A chemically amplified type resist composition will be described by taking as an example a resist composition containing t-butoxycarbonyl polyvinylphenol (t-BOCPVP) added with photoacid generator (PAG) having a function of forming acid when light is applied. In the light exposed area of a resist, a t-BOC group is eliminated by a thermal process after the exposure, a so-called post exposure baking (PEB), and isobutene and carbon dioxide are produced. This deprotection reaction progresses catalytically when t-BOC group was eliminated, to produce the polarity change in the exposed area. By selecting a developer suitable for such a large polarity change in the exposed area, a resist pattern can be easily formed.

In order to realize integrated circuit devices of higher integration, photolithography technologies using argon fluoride (ArF) excimer laser having a wavelength (193 nm) shorter than KrF excimer laser have been studied widely. Phenol resin has a high absorption at this wavelength and so it is necessary to develop other base resins.

If a carboxylic acid ester plays a chemically amplifying part at a side chain of a monomer unit of a polymer constituting a chemically amplified type resist, known protective groups suitable for this carboxyl group are only a t-butyl group, 1,1-dimethylbenzyl group, a tetrahydropyranyl group, a 3-oxocyclohexyl group, an isobornyl group and the like. It is highly desired to provide more effective protective groups.

SUMMARY OF THE INVENTION

It is an object of the present invention to provide a resist composition suitable for exposure light in a deep ultraviolet range, typically KrF or ArF excimer laser.

It is another object of the present invention to provide a resist pattern forming method which uses a resist composition suitable for exposure light in a deep ultraviolet range, typically KrF or ArF excimer laser.

According to one aspect of the present invention, there is provided a resist composition comprising: a polymer containing a carboxyl group with a protection group at a side chain of a monomer unit, the polymer being insoluble to basic aqueous solution and becoming soluble to basic aqueous solution when the protective group of the carboxyl group is eliminated from the side chain, the protective group of the carboxyl group being represented by:

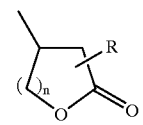

(1)

where R is a hydrogen atom or a single-bonded hydrocarbon group, n is an integer 1 to 4, and R is attached to a position other than the ester attached the third position.

According to another aspect of the present invention, there is provided a method of forming a resist pattern comprising the steps of: coating a resist material containing the above-described resist composition added with a photoacid generator on a substrate to form a resist film; selectively exposing the resist film with light capable of inducing dissolution of the photoacid generator; and developing the exposed resist film with basic aqueous solution.

As the resist film made of the resist material containing the resist composition added with the photoacid generator is exposed, acid is generated in the exposed area. The acid eliminates the protective group of the carboxyl group. At this time, protonic acid is generated. The reaction of the protonic acid eliminates the protective group of the carboxyl group. Since acid necessary for elimination of the protective group can be regenerated in the above manner, sensitivity can be improved.

This resist material does not contain any aromatic rings and conjugated double bonds having a strong absorption in the deep ultraviolet region, so that high transparency can be obtained in the deep ultraviolet region. It is therefore possible to use this resist material with photolithography using exposure light of a very short wavelength such as ArF excimer laser.

As above, it is possible to provide a resist composition capable of forming a fine positive resist pattern with less swelling at a practical sensitivity.

DETAILED DESCRIPTION OF THE PREFERRED EMBODIMENTS

A resist composition according to an embodiment of the invention comprises a polymer containing a carboxyl group with a protective group at a side chain of a monomer unit, the polymer being insoluble to basic aqueous solution and becoming soluble to basic aqueous solution when the protective group of the carboxyl group is eliminated from the side chain. The protective group of this carboxyl group is represented by:

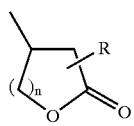
(1)

where R is a hydrogen atom or a single-bonded hydrocarbon group, n is an integer 1 to 4, and R is attached to a position other than the ester attached the third position. R is preferably an alkyl group, an alkoxyl group, or an alkoxyl carbonyl group. When this polymer is used as resist material, photoacid generator (PAG) is added which is dissolved when it absorbs light and generates acid which induces elimination of the protective group of the carboxyl group. The mechanism of chemical amplification of this resist composition will be described.

The photoacid generator in the resist film generates acid when light is applied. As the resist film is heated after the exposure, the already generated acid plays as catalyst and the following reaction progresses in the exposed film area.

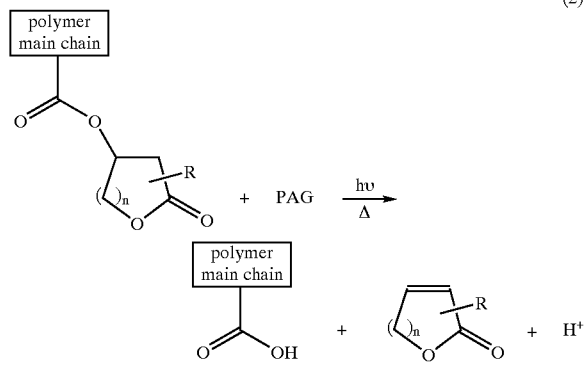
(2)

where R and n have the same meaning as the formula (1).

An acid sensitive polymer as the base resin of the resist composition of this embodiment contains a protective group at the ester group of a monomer unit, the protective group being easily eliminated by heat under the acid catalyst. As the protective group is eliminated, proton acid is regenerated so that high sensitivity can be achieved. After the protective group is eliminated, a carboxylic acid is generated. Therefore, the exposed area of the resist film can be developed with a basic aqueous solution. The resist pattern is a positive pattern with the exposed portion being dissolved and removed. In this embodiment, since a pattern is formed by utilizing a change in the polarity of the polymer, a pattern without swelling can be formed.

The acid sensitive polymer as the base material resin of the resist composition of this embodiment may be a copolymer. In this case, in addition to the provision of a protective group easily eliminated by heat under the acid catalyst at the ester group of a first monomer unit, it is preferable to provide a similar functional group also at the ester group of a second monomer unit. In this case, since both the protective groups of the copolymer can be eliminated through acid catalyst reaction, it is possible to obtain sensitivity and resolution higher than a copolymer in which the protective group of only one monomer unit is eliminated and a change in dissolution is given.

The acid sensitive polymer as the basic resin of the resist composition of this embodiment is not limited to a particular material so long as it satisfies the condition of a chemical amplification. However, if resistance to dry etching in the same order as novolac resist is required, then it is preferable to use other copolymers such as an acrylate polymer, a methacrylate polymer, a vinylphenol polymer, an N-substituted maleimide polymer, and a styrene polymer. The acrylate and methacrylate polymers in particular are suitable for use with deep ultraviolet light wavelength because they have a weak absorption. In other words, if deep ultraviolet exposure light is to be used, it is desired to use a polymer having the structure not containing a chromophore with a large extinction coefficient such as an aromatic ring and conjugated double bonds having a strong absorption in the deep ultraviolet region.

If an exposure light in the very short wavelength range such as ArF excimer laser is to be used, it is necessary to provide a resistance to dry etching as well as transparency at the wavelength (193 nm) of this exposure light. It is therefore preferable to use a polymer which does not contain an aromatic ring with a strong absorption but contains a polycyclic and alicyclic hydrocarbon group with a high resistance to dry etching such as an ester group containing an adamantyl and a norbornyl group. Use of the acrylate and methacrylate polymers in particular are recommended.

The molecular weight (weight-average molecular weight $M_w$) of a (meth)acrylate and other acid sensitive polymers may take a value in a large range. The molecular weight of such polymers is preferably 2,000 to 1,000,000, and more preferably 3,000 to 50,000.

Preferred acid sensitive polymers according to an embodiment of the invention include those polymers represented by the following general formulas. m in these general formulas is the number of monomer units (repeating units) necessary for obtaining the weight-average molecular weight. LAC is the lactone group represented by the formula of the protective group described previously. X is an optional replacement group unless otherwise specifically limited, such as hydrogen atom, halogen atom such as chlorine and bromine, lower alkyl group such as methyl group, and cyano group.

(1) (Meth)acrylate Polymer

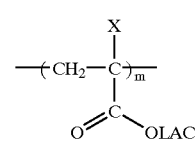
(3)

(2) Styrene Polymer

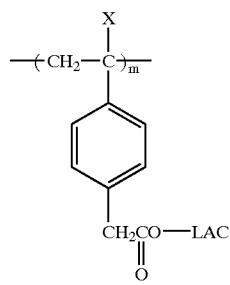
(4)

(3) Fumaric Acid Polymer

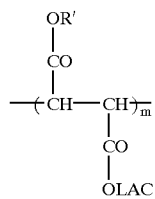
(5)

In the above formulas, R' may be LAC or alkyl group such as methyl group, isopropyl group and t-butyl group, aryl group such as phenyl group and benzyl group, or other groups.

(4) Vinyl Benzoic Acid Polymer

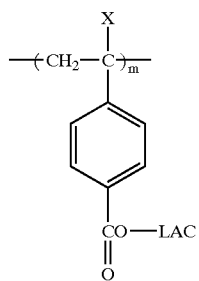
(6)

(5) Norbornene Carboxylic Acid Polymer

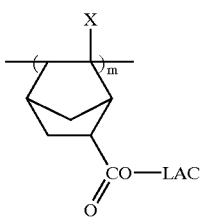
(7)

(6) Itaconic Acid Polymer (8)

(7) Maleic Acid Polymer (9)

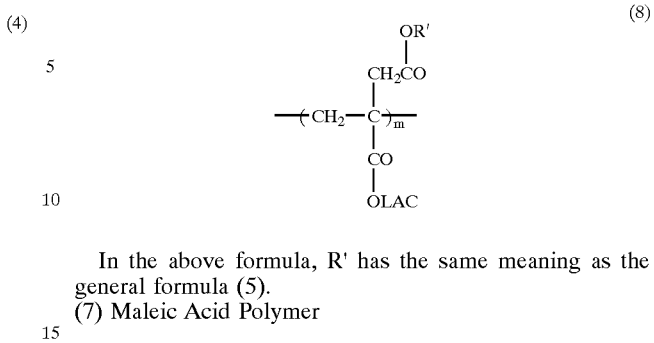

In the above formula, R' has the same meaning as the general formula (5).

In the above formula, R' has the same meaning as the general formula (5).

These polymers may be combined with another suitable monomer unit to form a desired copolymer or a terpolymer.

Next, another embodiment of this invention will be described by taking as an example an acid sensitive polymer mainly containing a (meth)acrylate polymer.

The general formula of an acid sensitive polymer mainly containing a (meth)acrylate polymer is given by:

(10)

A (meth)acrylate terpolymer can also be represented in the similar manner as above.

In the above formula, R' is a hydrogen atom or an optional substituent such as halogen, alkyl group and methylol group. Y is an optional substituent such as alkyl group or alicyclic hydrocarbon group such as adamantyl or norbornyl group.

m and n are a mol ratio of each monomer unit, and m+n=1. X and LAC have the same substituents as the general formulas (3) to (9).

These and other (meth)acrylate polymers inclusive of copolymers can be prepared by a polymerization method generally used in polymer chemistry. For example, a (meth) acrylate polymer can be prepared by heating proper monomer compositions in the presence of 2,2'-azobisisobutyronitrile (AIBN) as the free radical initiator to perform free radical polymerization. An acid sensitive polymer made of a polymer other than the (meth)acrylate polymer can also be manufactured by known methods.

The present inventors have also found that if the acid sensitive polymer in the resist composition takes the form of a copolymer, it is preferable that a monomer unit to be polymerized with another monomer unit has a carboxyl group of protective group different from that of the other monomer unit, as shown by the general formula (10). Namely, the acid sensitive copolymer may have a first monomer unit containing a carboxyl group with a protective group as the lactone unit shown in the general formula (1) in addition to a second monomer unit containing a different carboxyl group with a protective group, and such combination is preferable. This different protective group can be deprotected by the generated acid and is preferably given by:

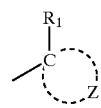
(11)

where $R_1$ is an alkyl group of a straight chain or branched chain containing one to four carbon atoms, or a replacement group of this alkyl group. Z is an atom group constituting an alicyclic hydrocarbon group together with the carbon atom attached to $R_1$. The carboxyl group with a protective group of the second monomer unit may take an optional form, but it preferably has the following general formula:

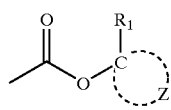
(12)

where $R_1$ and Z have the same meanings as the general formula (11).

In more detail, the acid sensitive copolymer having carboxyl groups with protective groups of the first and second monomer units is preferably given by:

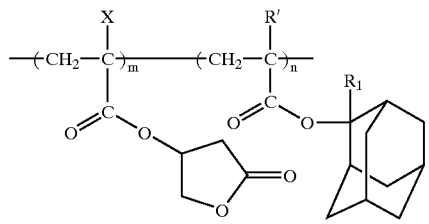
(13)

where R', X, m and n are the same in the general formula (10), and $R_1$ is the same in the general formula (11). The polycyclic group attached to $R_1$ is an adamantyl group. R' and X attached to the carbon atom on the main chain may be the same or different. R' and X are preferably a hydrogen atom or a lower alkyl group such as a methyl group.

A preferred structure of an acid sensitive copolymer is a γ-butyrolactone-3-yl methacrylate/2-methyl-2-adamantyl methacrylate copolymer given by:

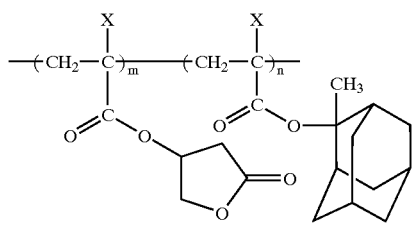
(14)

where X is a methyl group or a hydrogen atom, and two X's may be the same or different. m and n are the same in the general formula (10).

The resist composition containing such a copolymer or a copolymer containing a different polycyclic and alicyclic ester can provide a high resistance to dry etching (RIE resistance). If RIE resistance is desired to be comparable to that of novolac resist now commonly used, it is preferable that the second monomer unit of a copolymer, 2-methyl-2-adamantyl methacrylate, has a content of 50 mol %. Since this copolymer does not have any aromatic rings and conjugated double bonds having strong absorption in the very short wavelength range, transparency is high at the very short wavelength (193 nm) such as ArF excimer laser.

Generally, the content of the first monomer unit, γ-butyrolactone-3-yl methacrylate, which forms the copolymer given by the general formulas (14), is preferably about 20 to 70 mol %. If the content of the first monomer unit is smaller than 20 mol %, a fine-patterning becomes difficult, whereas if it is larger than 70 mol %, resin itself becomes soluble to a basic aqueous developer. It is preferable to set the content of γ-butyrolactone-3-yl methacrylate to 30 to 60 mol %.

The mechanism of chemical amplification of the copolymer given by the general formulas (13) and (14) is the same as that of a single-composition polymer described with the general formula (2), with the incorporation of similar reaction by the second monomer unit. Next, the mechanism of chemical amplification of a copolymer will be described.

It is well known that a polymer of acrylic acid or methacrylic acid has high transparency in the deep ultraviolet range. For example, two types of the ester portions of a copolymer of γ-butyrolactone-3-yl methacrylate and 2-methyl-2-adamantylmethacrylate given by the general formula (14) do not contain a chromophore with strong extinction coefficient at 190 to 250 nm. Therefore, the copolymer in combination with a proper amount of photoacid generator can provide resist material having a high sensitivity applicable even to such short wavelength exposure.

Use of the resist material made of the copolymer given by the general formula (14) in combination with photoacid generator allows the following reactions to progress independently or at the same time in the exposed area.

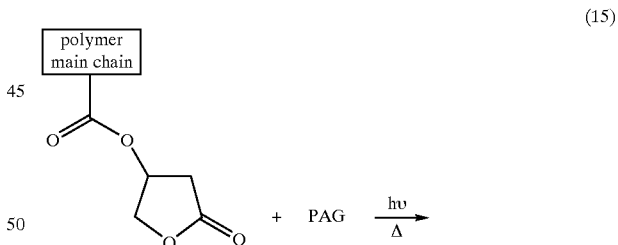
(15)

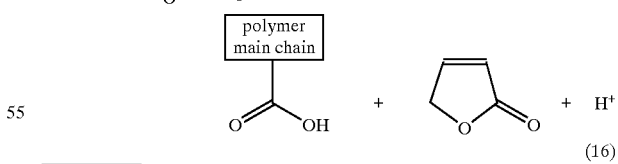
(16)

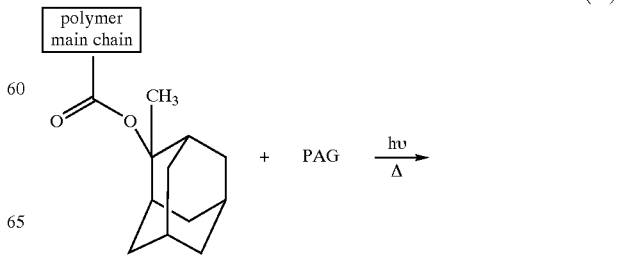

-continued

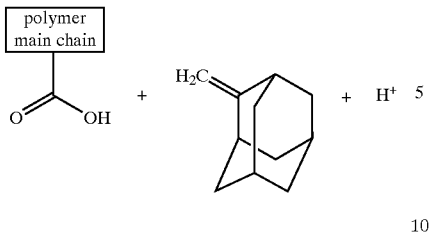 + H⁺

(3) Halide

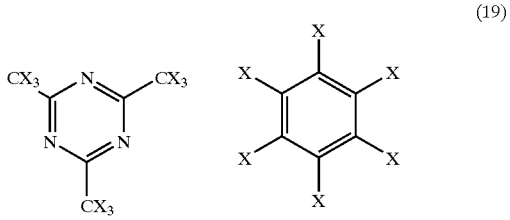

(19)

The ester group of each monomer unit of the copolymer given by the general formulas (13) and (14) contains a protective group being easily deprotected by heat under acid catalyst. As the protective group is deprotected protonic acid is regenerated so that high sensitivity can be achieved. After the protective group is deprotected, carboxylic acid is generated. Therefore, the exposed area of the resist film becomes soluble to a basic aqueous solution and the film can be developed with a basic aqueous solution. The obtained resist pattern is a positive pattern with the exposed area being dissolved and removed. In this case, since a pattern is formed by utilizing a change in the polarity of the polymer, a pattern without swelling can be formed.

The photoacid generator generates protonic acid under the exposure of radiation such as ultraviolet rays, far ultraviolet rays, vacuum ultraviolet rays, electron beams, and X-rays. For example, the photoacid generator of the embodiments may use the following materials.

(1) Onium Salt

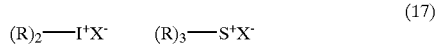

(17)

where R is an aromatic group, an alicyclic hydrocarbon group, or their substituted group. For example, X is $BF_4$, $PF_6$, $AsF_6$, $SbF_6$, $CF_3SO_3$ or $ClO_4$.

(2) Sulfonic Acid Ester

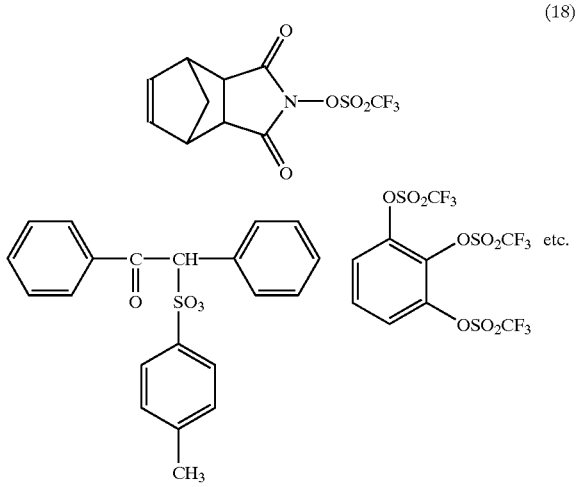

(18)

where X is Cl or Br for example.

The resist composition of the embodiments may contain each of these photoacid generators by a desired amount. According to the knowing of the present inventors, the amount of a photoacid generator is preferably 0.1 to 50 wt. % to the total weight of a polymer. If the content of a photoacid generator is larger than 50 wt. %, light is absorbed excessively and patterning becomes difficult. The amount of a photoacid generator to be used is more preferably 1 to 15 wt. % to the total weight of a polymer. It is preferable that the structure of a polymer and a photoacid generator and the amount of the photoacid generator to be used are selected so that an absorbance at the exposure wavelength in a resist film becomes 1.6 or smaller. If ultraviolet rays, particularly very short wave ultraviolet rays, are used, it is preferable that the absorbance of light having a wavelength of 180 to 300 nm becomes 1.6 or lower.

The resist composition of this embodiment is used as resist solution obtained by dissolving the acid sensitive polymer and photoacid generator in appropriate organic solvent. Recommended as organic solvent suitable for the preparation of resist solution are ethyl lactate, methylamyl ketone, methyl-3-methoxypropionate, ethyl-3-ethoxypropionate, propylene glycol methyl ether acetate, and the like, although the materials are not limited only to these. Theses solvents may be used singularly, or if necessary, two or more solvents may be used as a mixture. The amount of solvent to be used is not particularly limited, but it is preferable to use the amount sufficient for obtaining a viscosity suitable for coating such as spin coating and also sufficient for obtaining a desired resist film thickness.

The resist solution may be added with auxiliary solvent in addition to the above solvent (main solvent), if necessary. Although it is not necessary to add auxiliary solvent if the solubility of solution and the coating uniformity are high, the auxiliary solvent is effective if solution of a low solubility is used or if the coating uniformity cannot be obtained. Generally, the auxiliary solvent is preferably added by 1 to 30 wt. % relative to the main solvent, or more preferably 10 to 20 wt. %. Auxiliary solvents such as butyl acetate, γ-butyrolactone, and propylene glycol methyl ether are useful.

A resist pattern, particularly a positive resist pattern, can be formed on a substrate by using the resist composition described above. A resist pattern is generally formed in the following manner.

First, a resist composition is coated on a substrate to form a resist film. This substrate is a general substrate used by a semiconductor device or other devices and may be a silicon substrate, a glass substrate, a non-magnetic ceramic substrate or the like. The surface of a substrate may be formed with, if necessary, a thin film such as a silicon oxide film, a wiring metal film, an interlayer insulating film, and a magnetic film. The substrate may be formed with various types of wiring layers, circuits or the like. The substrate may be subjected to a hydrophobic process by a well-known manner in order to raise an adhesion of a resist film. Suitable hydrophobic processing reagent may be 1,1,1,3,3,3-hexamethyldisilazane (HMDS).

A resist film can be formed by coating resist solution on a substrate. There are many known methods of coating resist solution, such as spin coating, roll coating, dip coating, and spray coating. Of these, the spin coating is useful. The resist film is recommended to be about 0.1 to 200 μm thick. In the case of KrF or ArF excimer laser exposure, a range of 0.1 to 1.5 μm is recommended. The thickness of a resist film may be changed in a large range in accordance with application fields of the resist film.

A resist film coated on a substrate is preferably subjected to a thermal process (prebake) for about 30 to 120 seconds at a temperature of about 60 to 180° C. This prebake may be performed by using a heating means commonly used for resist processes. Suitable heating means may be a hot plate, an infrared heating oven, a microwave heating oven, and the like.

Next, the resist film after the prebake is selectively exposed in an exposure system. Suitable exposure systems may be commercially available ultraviolet (far ultraviolet, deep ultraviolet) exposure system, X-ray exposure system, electron beam exposure system and the like. The exposure conditions are preferably set independently for each system. In this embodiment, excimer laser (KrF laser at a wavelength of 248 nm, ArF laser at a wavelength of 193 nm) is used as exposure light. In this specification, exposure light includes radiation rays used with an exposure system.

Next, the resist film after the exposure is subjected to post-exposure baking (PEB) to activate deprotection reaction of the protective groups under acid catalyst. This PEB may be performed in the manner similar to the prebake. For example, it is performed at the baking temperature of about 60 to 180° and a baking time of about 30 to 120 seconds. These baking conditions are preferably controlled in accordance with a pattern size, profile and the like.

The resist film after the PEB is developed in a basic aqueous solution. For this development, a usual developing unit such as a spin developer, a dip developer and a spray developer may be used. The basic aqueous solution usable as developer may be aqueous solution of hydroxide of metal belonging to groups I and II in the periodic table, typically potassium hydroxide, or aqueous solution without metal ions such as tetraalkylammonium hydroxide. Aqueous solution of tetramethylammonium hydroxide (TMAH) is more preferable for a developer. In order to improve the development performance, an additive such as surfactant may be used. By this development, the exposed area of the resist film is dissolved and removed to leave only an unexposed area as a resist pattern on the substrate.

Next, specific embodiments of synthesis of an acid sensitive polymer, preparation of a resist composition, and formation of a resist pattern will be described. The following embodiments are illustratively given and do not limit the scope of the present invention.

First, a synthesis method of γ-butyrolactone-3-yl methacrylate will be described. A dropping funnel, a calcium chloride tube and a nitrogen inlet tube were attached to a 200-ml three-necked flask dried sufficiently, and nitrogen was introduced to the reaction system. A 80 ml of anhydrous methylene chloride, 8.0 g (78.4 mmol) of 3-hydroxy-γ-butyrolactone, 9.84 g at anhydrous triethylamine, and 10 mg of N,N-dimethylaminopyridine were added to the flask and stirred with a Teflon-coated stirrer bar in a nitrogen atmosphere at −30° C. 8.2 g of methacryloyl chloride was injected to the dropping funnel and was added dropwise for one hour, with the temperature of reaction solution being carefully maintained at −30° C.

Thereafter, the solution was stirred for one hour at −30° C., and then stirred for one hour at room temperature. The reaction solution was transferred to a 300 ml separatory funnel, washed with 100-ml of water and then with brine. The water layer was extracted three times with methylene chloride and added to the organic layer. The collected organic layer was dried with the anhydrous sodium sulfate, and the dried organic layer was filtered through a filter paper. The solvent of the filtered solution was evaporated under vacua. The obtained brown oil was purified and light yellow γ-butyrolactone-3-yl methacrylate was obtained.

The yield at the product was 7.34 g (55%). The product was analyzed with proton NMR, the results being given in the following. s in the parentheses represents singlet and d represents doublet.

$^1$HNMR (CDCL$_3$, δ, J in Hz): 1.95 (3H, s), 2.67 (1H, d, J=19), 2.90 (1H, dd, J=19, 7), 4.19 (1H, d, J=11), 4.55 (1H, dd, J=11, 4.5), 5.50 (1H, dd, J=6.5, 7.5), 5.67 (1H, s), 6.15 (1H, s).

Next, a synthesis method of a copolymer of γ-butyrolactone-3-yl methacrylate and 2-methyl-2-adamantylmethacrylate will be described.

γ-butyrolactone-3-yl methacrylate of 5.0 g (29.4 mmol), 2-methyl-2-adamantylmethacrylate of 5.55 g (24.05 mmol), dioxane of 17.8 ml and AIBN of 1.31 g (8 mmol) were added in a 100-ml flask and stirred with a Teflon-coated stirrer bar for 8 hours at 70° C. under nitrogen atmosphere. The reaction solution was diluted with tetrahydrofuran (THF) and dropped into methanol of 1 liter containing a small amount of hydroquinone to be precipitated and the precipitate was filtered with a glass filter. The precipitate was dried for 16 hours under the conditions of 0.1 mmHg and 45° C. The obtained white powder was again dissolved with THF. This precipitation and dry operation was repeated twice to obtain white resin powder. From the proton NMR analysis, the obtained resin powder was confirmed to be a copolymer with a ratio of lactone:adamantyl=46:54. A transmittance of the copolymer was 96% at a wavelength of 248 nm and 64% at a wavelength of 193 nm (with a film thickness of 1 μm on a quartz substrate).

The weight was 9.07 g (86%). The weight-average molecular weight was 29300 (calculated to standard polystyrene) and the dispersion was 2.56. The results of infrared spectrophotometry (IR spectrophotometry) were given below.

IR(KRS-5, cm$^{-1}$): 2914, 1793, 1724, 1250, 1147, 1101.

Next, a method of forming a resist pattern by using KrF excimer laser will be described.

The above-synthesized copolymer of γ-butyrolactone-3-yl methacrylate and 2-methyl-2-adamantyl methacrylate was dissolved in propylene glycol methyl ether acetate (PGMEA) to obtain 15 wt. % solution. Auxiliary solvent of γ-butyrolactone of 8 wt. % was also added to this solution. This solution was sufficiently dissolved with triphenylsulfonium trifluoromethanesulfdnate of 2 wt. % to obtain resist solution. This resist solution was filtered with a Teflon membrane filter of 0.2 μm thick and spin-coated on a silicon substrate subjected to an HMDS process with hexametyldisilazane (HMDS). The substrate was pre-baked for 60 seconds at 130° C. to form a resist film of 0.7 μm thick. This resist film was exposed by a KrF excimer laser stepper (NA (numerical aperture)=0.45), baked for 60 seconds at 110° C., developed with a 2.38% TMAH developer and rinsed with deionized water. A line-and-space pattern of 0.25 μm was obtained at an exposure dose of 25.0 mJ/cM$^2$.

Next, a method of forming a resist pattern by using ArF excimer laser will be described.

The resist solution prepared by the same method as the method of forming a resist pattern by using KrF excimer laser was coated on a silicon substrate subjected to an HMDS process to form a resist film of 0.5 µm thick. This resist film was exposed by a ArF excimer laser developer (NA=0.55), baked for 60 seconds at 110° C., developed with a 2.38% TMAH developer, and rinsed with deionized water. A line-and-space pattern of 0.18 µm was obtained at an exposure dose of 13.2 mJ/cm$^2$.

Next, a method of forming a resist pattern by using another photoacid generator will be described.

A copolymer of γ-butyrolactone-3-yl methacrylate and 2-methyl-2-adamantyl methacrylate was dissolved in PGMEA to obtain 15 wt. % solution. Resist solution was obtained by adding diphenylliodonium trifluoromethane-sulfonate of 2 wt % relative to the resin. This resist solution was spin-coated on a silicon substrate subjected to an HMDS process, pre-baked for 60 seconds at 120° C. to form a resist film of 0.5 µm thick. This resist film was exposed by an ArF excimer laser developer, baked for 60 seconds at 110° C., developed with a 2.38% TMAH developer, and rinsed with deionized water. A line-and-space pattern of 0.18 µm was obtained at an exposure dose of 11.2 mJ/cm$^2$.

Next, an example of using norbornyl methacrylate instead of using 2-methyl-2-adamantylmethacrylate of the above embodiment will be described. First, a synthesis method of a polymer of γ-butyrolactone-3-yl methacrylate and norbornyl methacrylate will be described.

γ-butyrolactone-3-yl methacrylate of 5.0 g (29.4 mmol), norbornyl methacrylate of 5.76.g (29.4 mmol), dioxane of 19.6 ml and AIBN of 1.44 g (8.8 mmol) were added in a flask of 100 ml and stirred with a Teflon-coated stirrer bar for 8 hours at 70° C. under nitrogen atmosphere. The reaction solution was diluted with THF and dropped into methanol of 1 liter containing a small amount of hydroquinone to be precipitated and the precipitate was filtered with a glass filter. The filtrate was dried for 16 hours under the conditions of 0.1 mmHg and 45° C. The obtained white powder was again dissolved with THF. This precipitation and dry operation was repeated twice to obtain white resin powder. From the proton NMR analysis, the obtained resin powder was confirmed to be a copolymer with a ratio of lactone:norbornyl=49:51. A transmittance of the copolymer was 96% at a wavelength of 248 nm and 67% at a wavelength of 193 nm (with a film thickness of 1 µm on a quartz substrate).

The yield was 8.61 g (80%). The weight-average molecular weight was 17600 (calculated to standard polystyrene) and the dispersion factor was 1.76. The results of IR spectrophotometry were given below.

IR(KRS-5, cm$^{-1}$): 2961, 1792, 1726, 1250, 1147, 1101.

The copolymer of γ-butyrolactone-3-yl methacrylate and norbornyl methacrylate synthesized by the above method was dissolved in PGMEA to obtain 15 wt. % solution. Resist solution was obtained by adding triphenysulfonate trifluoromethanesulfonate of 2 wt % to the resin (containing γ-butyrolactone of 6 wt. % as auxiliary solvent). This resist solution was spin-coated on a silicon substrate subjected to an HMDS process, pre-baked for 60 seconds at 120° C. to form a resist film of 0.5 µm thick. This resist film was exposed by an ArF excimer laser developer, baked for 60 seconds at 110° C., developed with a 2.38% TMAH developer, and rinsed with deionized water. A line-and-space pattern of 0.18 µm was obtained at an exposure dose of 12.2 mJ/cm$^2$.

Next, the dry etching resistance will be described.

Resist films of 1 µm thick were formed on silicon substrates by coating the lactone/adamantyl resist solution containing a copolymer of γ-butyrolactone-3-yl methacrylate and 2-methyl-2-admantyl methacrylate and the lactone/norbornyl resist solution containing a copolymer of γ-butyrolactone-3-yl methacrylate and norbornyl methacrylate. For the comparison purpose, films of Nagase positive resist NPR-820 (manufactured by Nagase Industries, Co., Ltd.) as one example of commercially available novolac resist and films of polymethylmethacrylate (PMMA) were also formed. The etching was conducted with a parallel plate type reactive ion etching (RIE) system under the conditions of a microwave power of 200 W, a pressure of 0.02 Torr, a $CF_4$ gas flow rate of 100 sccm. The amount of a reduced thickness of each resist film through etching for 5 minutes was measured. The measured results are shown in the following table.

| Resist | Etching Rate (nm/min) |
| --- | --- |
| NPR-820 | 53.0 |
| PMMA | 80.5 |
| Lactone/Adamantyl | 80.9 |
| Lactone/Norbornyl | 69.0 |

From the above results, the etching resistance of a resist film of this embodiment is comparable to that of NPR-820 which is riovolac resist. The lactone/adamantyl resist film in particular shows a resistance in generally the same order as NPR-820. It was confirmed that both the resist films of this embodiment were superior to PMMA.

The present invention has been described in. connection with the preferred embodiments. The invention is not limited only to the above embodiments. It is apparent that various modifications, improvements, combinations, and the like can be made by those skilled in the art.

What is claimed is:

1. A resist composition comprising:
   a polymer containing a carboxyl group with a protective group at a side chain of a monomer unit, the polymer being insoluble to basic aqueous solution and becoming soluble to basic aqueous solution when the protective group of the carboxyl group is eliminated from the side chain, the protective group of the carboxyl group being represented by:

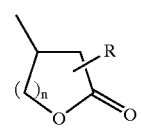

(1)

where R is a hydrogen atom or a single-bonded hydrocarbon group, n is an integer 1 to 4, and R is attached to a position other than the ester bonded position.

2. A resist composition according to claim 1, wherein R of the protective group is selected from the group consisting of an alkyl group, an alkoxyl group, or an alkoxyl carbonyl group.

3. A resist composition according to claim 1, wherein R of the protective group is a hydrogen atom and n is 1.

4. A resist composition according to claim 1, wherein the monomer unit of the polymer to be polymerized is a monomer unit selected from a group consisting of an acrylate monomer unit, a methacrylate monomer unit, a vinylphenol monomer unit, an N-substituted maleimide monomer unit, and a styrene monomer unit.

5. A resist composition according to claim 1, wherein the monomer unit of the polymer to be polymerized is a monomer unit having an ester group containing a polycyclic and alicyclic hydrocarbon unit.

6. A resist composition according to claim 5, wherein the polycyclic and alicyclic hydrocarbon unit includes an adamantyl group or a norbornyl group.

7. A resist composition according to claim 1, further comprising at least one solvent selected from a group consisting of ethyl lactate, methylamyl ketone, methyl-3-methoxypropionate, ethyl-3-ethoxypropionate, and propylene glycol methyl ether acetate.

8. A resist composition according to claim 7, further comprising at least one solvent selected from a group consisting of butyl acetate, γ-butyrolactone, and propylene glycol methyl ether.

9. A resist composition according to claim 1, further comprising a photoacid generator which generates acid inertly upon light exposure.

10. A resist composition according to claim 9, wherein the monomer unit of the polymer to be polymerized has a carboxyl group at a side chain of the monomer unit, the carboxyl group containing another protective group and capable of being eliminated by a reaction of acid generated by the photoacid generator, the other protective group being represented by:

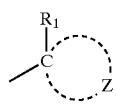

(11)

where $R_1$ is an alkyl group of a straight chain or branched chain containing one to four carbon atoms, or a substituted alkyl group, and Z is an atom group constituting an alicyclic hydrocarbon group together with the carbon atom attached to $R_1$.

11. A resist composition according to claim 1, wherein absorbance of light of the resist composition in a deep ultraviolet range from 180 to 300 nm wavelength is 1.6 or smaller.

12. A resist composition according to claim 11, wherein the monomer unit of the polymer to be polymerized has a carboxyl group at a side chain of the monomer unit, the carboxyl group containing another protective group and capable of being eliminated by a reaction of acid generated by the photoacid generator, the other protective group being represented by:

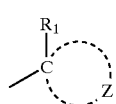

(11)

where $R_1$ is an alkyl group of a straight chain or branched chain containing one to four carbon atoms, or a substituted alkyl group, and Z is an atom group constituting an alicyclic hydrocarbon group together with the carbon atom attached to $R_1$.

13. A method of forming a resist pattern comprising the steps of:

coating a resist composition on a substrate to form a resist film, the resist composition comprising: a polymer containing a carboxyl group with a protective group at a side chain of a monomer unit, the polymer being insoluble to a basic aqueous solution and becoming soluble to a basic aqueous solution when the protective group of the carboxyl group is eliminated from the side chain, the protective group of the carboxyl group being represented by:

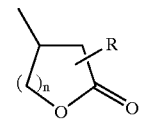

(1)

where R is a hydrogen atom or a single-bonded hydrocarbon group, n is an integer 1 to 4, and R is attached to a position other than the ester bonded position; and a photoacid generator which generates acid inertly upon light exposure;

selectively exposing the resist film with light capable of inducing dissolution of the photoacid generator; and developing the exposed resist film with a basic aqueous solution.

14. A resist composition according to claim 13, wherein absorbance of light of the resist composition in a deep ultraviolet region from 180 to 300 nm wavelength is 1.6 or smaller.

15. A method according to claim 13, wherein the monomer unit of the polymer to be polymerized has a carboxyl group at a side chain of the monomer unit, the carboxyl group containing another protective group and capable of being eliminated by a reaction of acid generated by the photoacid generator, the other protective group being represented by:

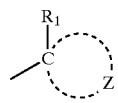

(11)

where $R_1$ is an alkyl group of a straight chain or branched chain containing one to four carbon atoms, or a replacement group of the alkyl group, and Z is an atom group constituting an alicyclic hydrocarbon group together with the carbon atom bonded to $R_1$.

* * * * *